United States Patent
Oka et al.

(10) Patent No.: US 10,175,269 B2
(45) Date of Patent: Jan. 8, 2019

(54) CURRENT DETECTOR

(71) Applicant: FUJI ELECTRIC CO., LTD., Kawasaki (JP)

(72) Inventors: Isao Oka, Suzuka (JP); Takanori Shintani, Suzuka (JP); Masahiro Tatsukawa, Gyoda (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 0 days.

(21) Appl. No.: 15/468,360

(22) Filed: Mar. 24, 2017

(65) Prior Publication Data
US 2017/0343586 A1 Nov. 30, 2017

(30) Foreign Application Priority Data

May 31, 2016 (JP) ................................. 2016-109010
Aug. 16, 2016 (JP) ................................. 2016-159524

(51) Int. Cl.
G01R 15/18 (2006.01)
H02M 1/00 (2006.01)
H02M 7/00 (2006.01)
G01R 15/20 (2006.01)

(52) U.S. Cl.
CPC ......... G01R 15/183 (2013.01); G01R 15/207 (2013.01); H02M 1/00 (2013.01); H02M 7/003 (2013.01); H02M 2001/0009 (2013.01)

(58) Field of Classification Search
CPC .......................... G01R 15/183; H02M 7/003
See application file for complete search history.

(56) References Cited

U.S. PATENT DOCUMENTS

| 7,679,357 | B2* | 3/2010 | Aratani | ............... | G01R 15/202 |
| | | | | | 324/117 H |
| 2011/0050222 | A1* | 3/2011 | Ueno | ................... | G01R 15/207 |
| | | | | | 324/253 |
| 2011/0221430 | A1* | 9/2011 | Ito | ......................... | G01R 15/20 |
| | | | | | 324/244 |
| 2011/0228508 | A1 | 9/2011 | Inuduka et al. | | |
| 2013/0028001 | A1 | 1/2013 | Yokota | | |

FOREIGN PATENT DOCUMENTS

| JP | 2006-194650 | 7/2006 |
| JP | 2011-217594 | 10/2011 |
| JP | 2013-48539 | 3/2013 |

* cited by examiner

*Primary Examiner* — Reena Aurora

(57) ABSTRACT

A current detector includes: a current detection unit including a plurality of cores made of magnetic material, in the plurality of penetration holes are penetrating through, respectively; a terminal block including a plurality of terminal connecting portions being arranged side by side in a direction perpendicular to an axial direction of the penetration holes, the terminal block being merged with the current detection unit; and a plurality of conductor bars, each having one end inserted into one of the penetration holes and another end connected to corresponding one of the terminal connecting portions.

10 Claims, 5 Drawing Sheets

CURRENT DETECTOR

CROSS REFERENCE TO RELATED APPLICATION

This application claims benefit of priority under 35 USC 119 based on Japanese Patent Application No. 2016-109010 filed on May 31, 2016 in Japan, and Japanese Patent Application No. 2016-159524 filed on Aug. 16, 2016 in Japan. The entire contents of the Japanese Patent Applications No. 2016-109010 and No. 2016-159524 are incorporated herein by reference.

BACKGROUND OF THE INVENTION

1. Field of the Invention

The present invention relates to a current detector merged with a terminal block.

2. Description of the Related Art

JP 2011-217594A discloses a power converter including a current detector and a terminal block of a typical configuration. The power converter includes an inverter unit, a current detector, and an output terminal block sequentially arranged on the upper surface of a base of a heat sink. The current detector is arranged such that an axial direction of cores is parallel to the upper surface of the base. Output terminals of the inverter unit extend parallel with the upper surface of the base and are connected to the output terminal block through the current detector. JP 2011-217594A teaches that the problem to be solved is to shorten the connection distance between a main circuit capacitor and the inverter unit, but does not mention any contrivance for reducing the length between the inverter unit and the output terminal block with the current detector interposed in between.

JP 2013-048539A discloses a power converter including a power conversion section having a minimized power bus bar, in which the size in the extending direction is reduced. Although the current sensors in the power converter are arranged in the extending direction of the power bus bar of the power conversion section, terminal blocks are arranged with the current detectors in a direction perpendicular to the extending direction of the power bus bar. The terminal blocks are fixed to a case of the power converter, and the current sensors are fixed to the terminal block via a terminal-side power bus bar formed into a substantially U-like shape.

JP 2006-194650A discloses a current sensor also serving as a terminal block in a power converter. The current sensor includes a bus bar connected to a bolt by crimped connection and molded by resin together with a core, a magnetic flux density sensing element, and a circuit board.

The power converter having a typical structure as disclosed in JP 2011-217594A has problems that the size of the power converter cannot be reduced in the direction in which the current detectors and the terminal blocks are arranged and that the height of the current detectors inevitably increases. As illustrated in JP 2011-217594A, the current detector has a greater height than the inverter unit and the output terminal block. The reason for the greater height of the current detector is that the current detector includes cores having the dimensions generally greater in the diameter direction, which is the height direction, than in the axial direction of the cores.

Although JP 2013-048539A deals with the conventional problem with the size of the power converter increased in the direction in which the current detectors and the terminal block are arranged, the current detectors still has a problem with the height, which is rather increased since the terminal blocks are arranged above the current detectors. JP 2013-048539A A has another problem with the structure which complicates the assembling process and is fragile because the power converter includes a plurality of current detectors fixed to the terminal blocks independently via terminal-side power bus bars.

JP 2006-194650A has achieved a decrease of the number of components and a reduction in size of the power converter due to the current sensors serving also as the terminal blocks, but still has a problem with the height of the current sensors. Further, JP 2006-194650A does not include any contrivance for providing the resin-molded portion, serving as the terminal blocks, with a particular shape sufficient to ensure mechanical strength of the current collectors. In addition, JP 2013-048539A and JP 2006-194650A have the common problem that there is only one terminal connection surface provided in the terminal blocks, which requires considerable design modifications if the connection direction of the terminals is necessary to be changed.

SUMMARY OF THE INVENTION

The present invention has been made to solve the conventional problems described above. An object of the present invention is to provide a terminal block-integrated current detector including a current detection unit and a terminal block merged with each other, while terminal connecting portions ensure sufficient mechanical strength with a reduced occupied volume of the current detection unit and the terminal block integrated together.

In order to achieve the object described above, the present invention inheres in a current detector encompassing a current detection unit including a plurality of cores made of magnetic material such that a plurality of penetration holes are penetrating through the cores; a terminal block including a plurality of terminal connecting portions being arranged side by side in a direction perpendicular to an axial direction of the penetration holes, the terminal block being merged with the current detection unit, and a plurality of conductor bars, each having one end inserted into one of the penetration holes and another end connected to corresponding one of the terminal connecting portions.

DESCRIPTION OF EMBODIMENTS

Hereinafter, with reference to the drawings, embodiments of the present invention will be described. It should be understood that the following embodiments are merely illustrative of the technical idea of the present invention, and the present invention is not limited to the explanations thereof.

First Embodiment

Figure 1:
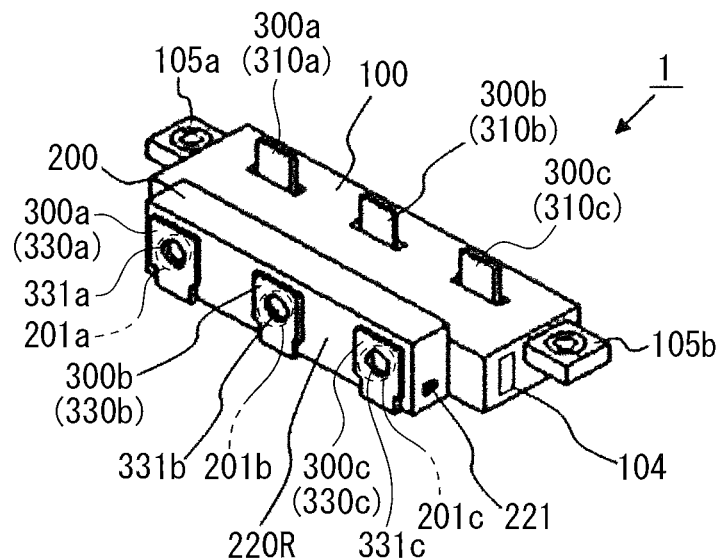
FIG. 1 is a perspective view of a current detector according to a first embodiment.
Figure 2:
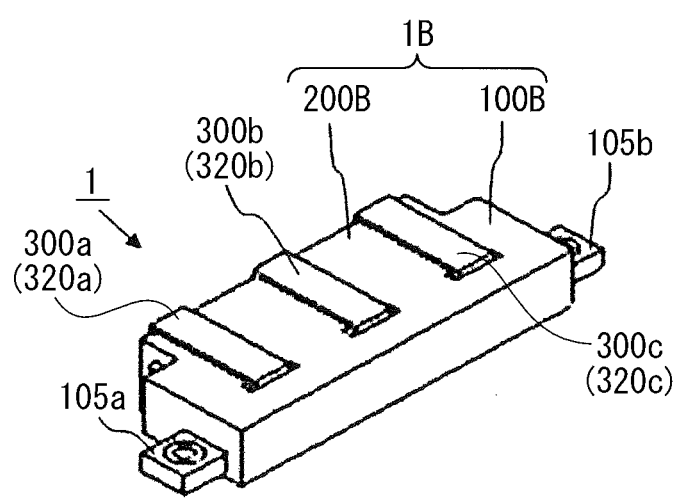
FIG. 2 is a perspective view of the current detector according to the first embodiment when viewed in a direction different from FIG. 1.

As illustrated in FIG. 1 and FIG. 2, a current detector 1 according to the first embodiment includes a current detection unit 100, a terminal block 200, and three conductor bars 300a, 300b, and 300c. The current detection unit 100 has a substantially rectangular parallelepiped including an installation surface 100B. As used herein, a direction vertical to the longitudinal direction of the installation surface 100B is referred to as "the height direction". The installation surface 100B is not always required to be brought in close contact with an opposed surface on which the installation surface 100B is to be placed.

Figure 3A:
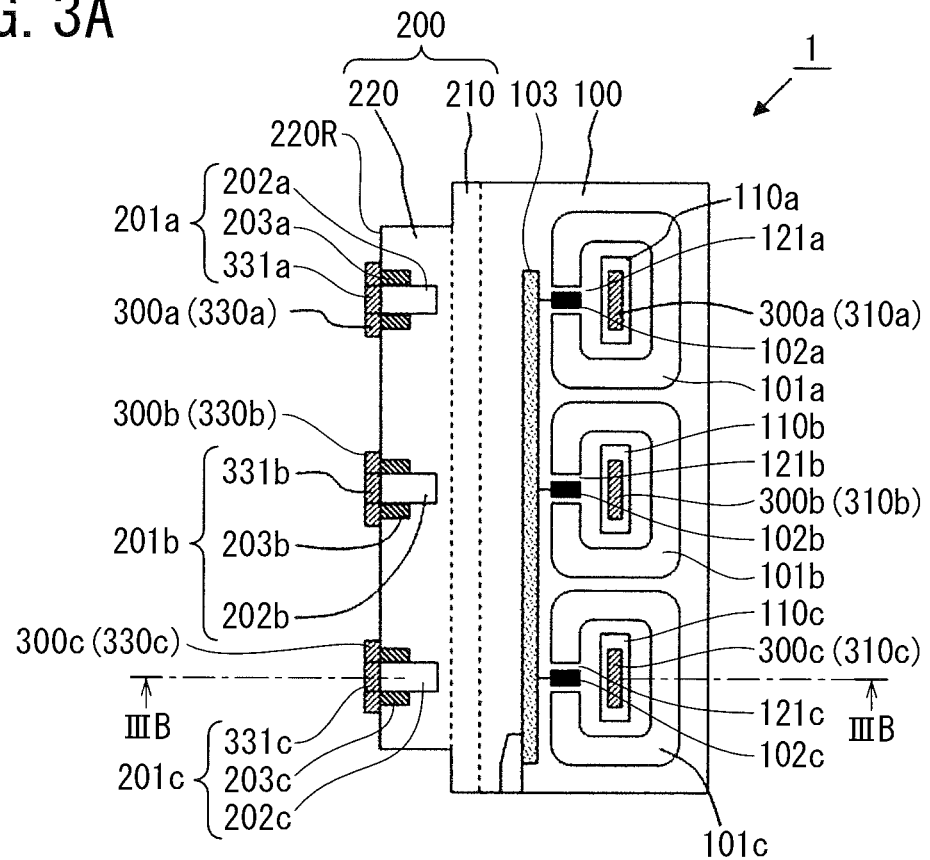
FIG. 3A is a top view schematically illustrating a structure of the current detector according to the first embodiment.
Figure 3B:
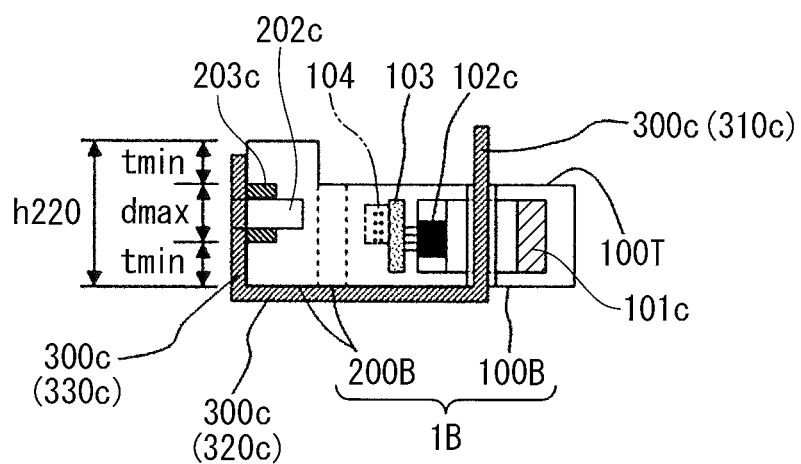
FIG. 3B is a cross-sectional view taken along line IIIB-IIIB in FIG. 3A.

As illustrated in FIG. 3A and FIG. 3B, the current detection unit 100 includes triple ring-shaped cores 101a, 101b, and 101c made of magnetic material and having gaps 121a, 121b, and 121c, triple magnetic-flux-density detection-elements 102a, 102b, and 102c located in the gaps 121a, 121b, and 121c, a circuit board 103 in which the magnetic-flux-density detection-elements 102a, 102b, and 102c are mounted, and connector 104 connected to the circuit board 103. The current detection unit 100 is provided with triple penetration holes 110a, 110b, and 110c penetrating the inside of the ring-shaped cores 101a, 101b, and 101c.

The triple cores 101a, 101b, and 101c are aligned in the longitudinal direction of the current detection unit 100 such that the axial direction of the respective cores 101a, 101b, and 101c is parallel to the height direction of the current detection unit 100. The current detection unit 100 thus has the shortest length in the height direction. Although FIG. 3A and FIG. 3B illustrate the rectangular ring-shaped cores, the cores may have a circular ring-like shape, and may be arranged in a zigzag manner in the longitudinal direction of the current detection unit 100.

As illustrated in FIG. 3A and FIG. 3B, the terminal block 200 includes a first terminal block 210 formed in a substantially rectangular parallelepiped having the same length in both the height direction and the longitudinal direction as the current detection unit 100, and a second terminal block 220 formed in a substantially rectangular parallelepiped having a greater length in the height direction and a shorter length in the longitudinal direction than the current detection unit 100.

The current detection unit 100, the first terminal block 210, and the second terminal block 220 are closely arranged on the same plane as the installation surface 100B of the current detection unit 100 and mereged together by resin molding so as to form a structure having an L-shaped cross section and the common installation surface 1B. The dashed lines in FIG. 3A and FIG. 3B are virtual lines represented for illustration purposes only to clearly define the current detection unit 100, the first terminal block 210, and the second terminal block 220.

The structure may be manufactured such that the cores 101a, 101b, and 101c, the magnetic-flux-density detection-elements 102a, 102b, and 102c, the circuit board 103, the connector 104, and nuts 203a, 203b, and 203c used for terminal connection as described below, are placed in a metal mold, filled with thermosetting resin such as epoxy resin or phenol rein, and cured by heat. Alternatively, a box structure including a hollow current detection unit with a lid may be prepared first, and the cores 101a, 101b, and 101c and the other members may be fixed into the current detection unit 100 afterward.

As illustrated in FIG. 1, FIG. 2, FIG. 3A and FIG. 3B, the conductor bars 300a, 300b, and 300c include first conductors 310a, 310b, and 310c, second conductors 320a, 320b, and 320c, and third conductors 330a, 330b, and 330c. The respective conductors having a rectangular section are continuously connected together.

The first conductors 310a, 310b, and 310c having a rectangular section are aligned such that the width direction is parallel to the longitudinal direction of the current detection unit 100, and protrude upward through the penetration holes 110a, 110b, and 110c of the current detection unit 100 toward a top surface 100T on the opposite side of the installation surface (the bottom surface) 100B of the current detection unit 100. The cores 101a, 101b, and 101c are laid inside the current detection unit 100 and open in the height direction to provide spaces from which the first conductors 310a, 310b, and 310c protrude. The electrical connections with targets for current detections are achieved in each of the spaces, which contribute to both a reduction in distance to the targets and a reduction in height of the cores.

The second conductors 320a, 320b, and 320c connected to the first conductors 310a, 310b, and 310c are elongated from the penetration holes 110a, 110b, and 110c along the installation surface 1B to the outer edge of the second terminal block 220. The third conductors 330a, 330b, and 330c further extend upward along a side surface 220R from the outer edge of the second terminal block 220 to complete the elongation of the conductor bars 300a, 300b, and 300c.

As illustrated in FIG. 3A and FIG. 3B, the terminal block 200 includes triple terminal connecting portions 201a, 201b, and 201c on the side surface 220R of the second terminal block 220. The terminal connecting portions 201a, 201b, and 201c respectively include terminal connection holes 202a, 202b, and 202c having a substantially cylindrical shape provided on the side surface 220R of the second terminal block 220, the nuts 203a, 203b, and 203c buried in opening ends of the terminal connection holes 202a, 202b, and 202c, and penetration holes 331a, 331b, and 331c open on the third conductors 330a, 330b, and 330c of the conductor bars 300a, 300b, and 300c.

In view of a resin thickness $t_{min}$ (the minimum thickness of the material of the current detection unit 100 and the terminal block 200) preliminarily determined as appropriate so as to ensure mechanical strength and electrical insulation, the height h220 of the second terminal block 220 is required to be greater than the sum of twice the resin thickness $t_{min}$ and the maximum diameter $d_{max}$ of the terminal connection holes 202a, 202b, and 202c (in this embodiment, the outer diameter of the nuts 203a, 203b, and 203c), in order to ensure enough space for the terminal connecting portions 201a, 201b, and 201c on the side surface 220R of the second terminal block 220. As described below in the second embodiment, the width w200 of the terminal block 200 is set greater than the sum of the resin thickness $t_{min}$ and the maximum diameter of the terminal connection holes 202a, 202b, and 202c.

The process of assembling the current detector 1 into the housing of the power converter together with, for example, the power semiconductor module is described below. As explained below, the assembling process requires a smaller number of steps, because the plural cores and the terminal block are merged together so that the assembling process does not include any complicated step. The process includes:

1. inserting the conductor bars 300a, 300b, and 300c into the corresponding penetration holes 110a, 110b, and 110c of the current detection unit 100 (triple conductor bars);
2. placing crimp terminals to the penetration holes 331a, 331b, and 331c of the conductor bars 300a, 300b, and 300c and fastening together with screws (triple parts);
3. placing the current detector 1 thus obtained in an installation position inside the housing of the power converter;
4. fastening joint portions 105a and 105b of the current detection unit 100 to the housing of the power converter with screws (two parts);
5. fastening the power semiconductor module to the housing with screws alongside the current detection unit 100;
6. inserting power cables into the crimp terminals and crimping together (triple power cables); and
7. welding the conductor bars 300a, 300b, and 300c to conductor bars of the power semiconductor module (triple sets of conductor bars).

Because the cores 101a, 101b, and 101c included in the current detector 1 are arranged such that the axial direction of the cores 101a, 101b, and 101c is parallel to the height direction of the current detection unit 100, the height of the current detection unit 100 can be reduced. The conductor bars 300a, 300b, and 300c stand out to the space above the current detection unit 100 to serve as connection portions connected to targets for current detection. The terminal block 200 has substantially the same height as the conductor bars 300a, 300b, and 300c sticking upward in order to keep the resin thickness for ensuring mechanical strength of the terminal connecting portions 201a, 201b, and 201c. Accordingly, a space-saving terminal-block integrated current-corrector with a reduced occupied volume is achieved.

As described above, according to the first embodiment of the present invention, a current detector encompassing the current detection unit and the terminal block having a sufficient mechanical strength of the terminal connecting portions can be achieved, because the current detection unit and the terminal block are merged together in the current detector so as to reduce the occupied volume.

Second Embodiment

Figure 4A:
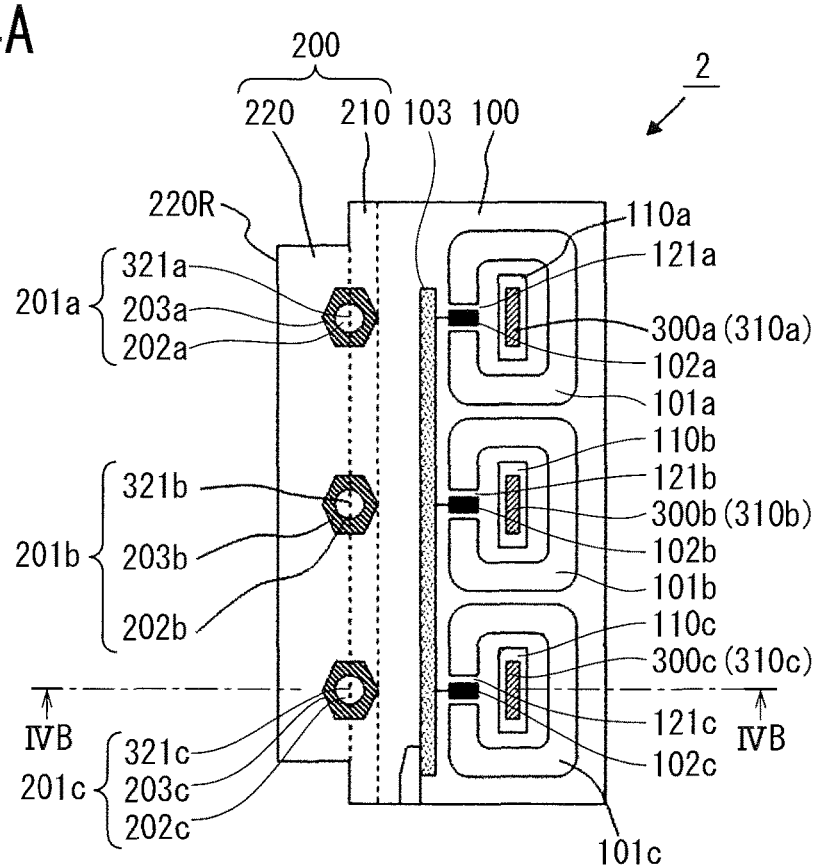
FIG. 4A is a top view schematically illustrating a structure of a current detector according to a second embodiment.
Figure 4B:
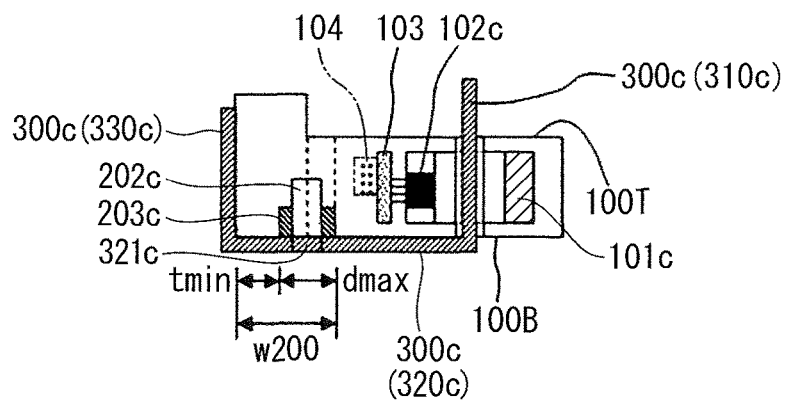
FIG. 4B is a cross-sectional view taken along line IVB-IVB in FIG. 4A.

A current detector 2 according to the second embodiment differs from the current detector 1 according to the first embodiment only in the positions of the triple terminal connecting portions 201a, 201b, and 201c, as illustrated in FIG. 4A and FIG. 4B.

The terminal connecting portions 201a, 201b, and 201c respectively include triple terminal connection holes 202a, 202b, and 202c having a substantially cylindrical shape provided on the installation surface 200B of the terminal block 200, triple nuts 203a, 203b, and 203c buried in opening ends of the terminal connection holes 202a, 202b, and 202c, and triple penetration holes 321a, 321b, and 321c open on the second conductors 320a, 320b, and 320c of the corresponding conductor bars 300a, 300b, and 300c.

The width w200, or the length measured in the short-side direction, of the terminal block 200 is set greater than the sum of the resin thickness $t_{min}$ and the maximum diameter $d_{max}$ of the terminal connection holes. Therefore, the positions of the terminal connecting portions 210a, 201b, and 201c can easily be changed without changing the dimensions of the terminal block 200.

Figure 5A:
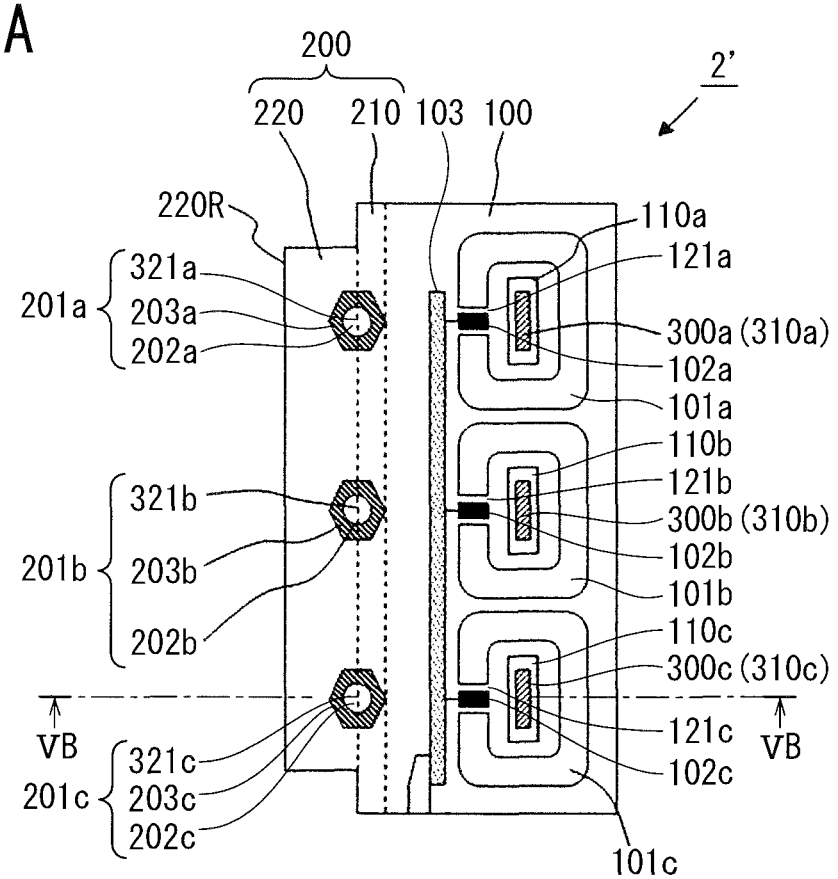
FIG. 5A is a top view schematically illustrating a structure of a current detector according to a modified example of the second embodiment.
Figure 5B:
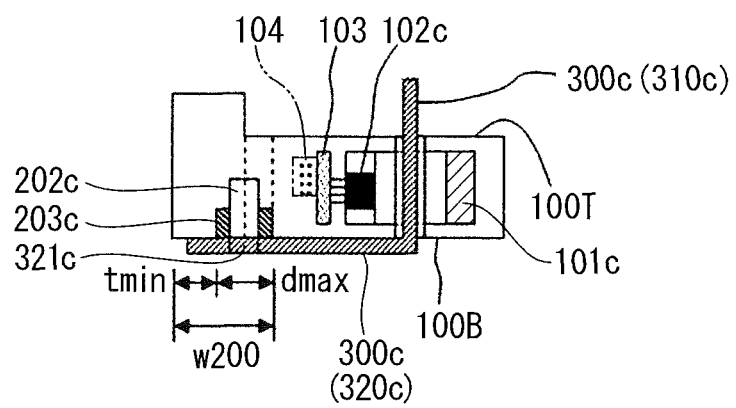
FIG. 5B is a cross-sectional view taken along line VB-VB in FIG. 5A.

According to the second embodiment, the conductor bars 300a, 300b, and 300c are supported by the penetration holes 110a, 110b, and 110c of the current detection unit 100 and the terminal connecting portions 201a, 201b, and 201c. Similar to the configuration illustrated in FIG. 1, FIG. 2, FIG. 3A and FIG. 3B, the conductor bars 300a, 300b, and 300c include first conductors 310a, 310b, and 310c, second conductors 320a, 320b, and 320c, and third conductors 330a, 330b, and 330c, respectively, and the third conductors 330a, 330b, and 330c extend upward along a side surface 220R of the second terminal block 220. However, as a modified example of the second embodiment illustrated in FIG. 5A and FIG. 5B, the third conductors 330a, 330b, and 330c adapted for the second embodiment may be omitted.

As described above, according to the second embodiment of the present invention, a current detector encompassing the current detection unit and the terminal block having a sufficient mechanical strength of the terminal connecting portions can be achieved, because the current detection unit and the terminal block are merged together in the current detector so as to reduce the occupied volume.

Reference Embodiment

Figure 6:
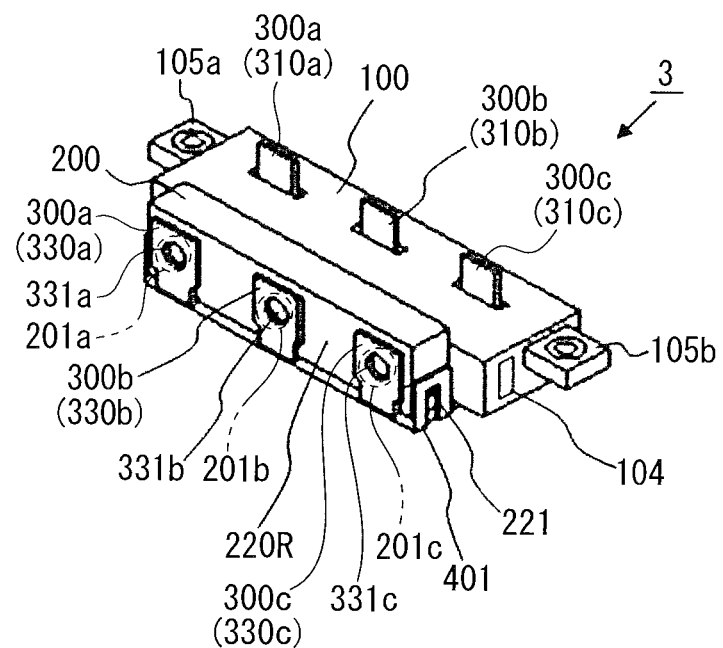
FIG. 6 is a perspective view illustrating a current detector according to a reference embodiment.
Figure 7:
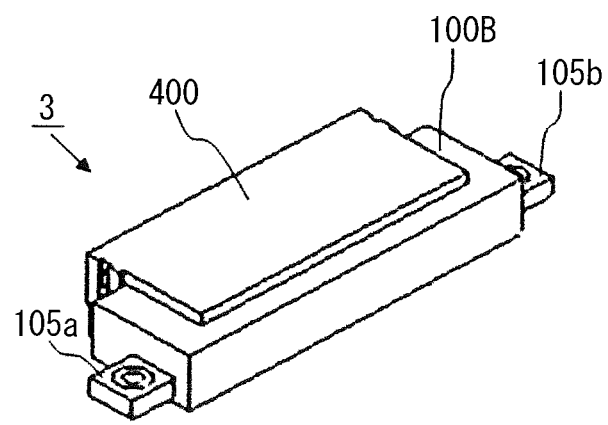
FIG. 7 is a perspective view of the current detector according to the reference embodiment when viewed in a direction different from FIG. 6.

A current detector 3 according to the reference embodiment differs from the current detector 1 according to the first embodiment in further including a protection cover 400 made of resin, as illustrated in FIG. 6 and FIG. 7. The protection cover 400 includes engaged portions 401 engaged with protrusions 221 for engagement provided on the side surfaces of the second terminal block 220, so as to be fixed to the current detector 3. The second terminal block 220 has a shorter length in the longitudinal direction than the first terminal block 210 so as to facilitate the engagement and fixation of the protection cover 400 to the current detector 3.

When the installation surface 1B of the current detector 1 is located closely to an opposed surface on which the installation surface 1B is to be placed, the protection cover 400 additionally attached contributes to dealing with a problem with electrical insulation.

The current detector 2 of the second embodiment may also additionally include a protection cover in the same manner as described above. The current detector 2 may use a protection cover only covering an area corresponding to the installation surface 100B of the current detection unit 100, and protrusions for engagement with the protection cover may be provided on the side surfaces of the current detection unit 100.

What is claimed is:
1. A current detector comprising:
a current detection unit including a plurality of cores made of magnetic material, wherein a plurality of penetration holes are respectively penetrating through the plurality of cores;
a terminal block including a plurality of terminal connecting portions being arranged side by side in a direction perpendicular to an axial direction of the penetration holes, the terminal block being merged with the current detection unit, each of the plurality of terminal connecting portions including a terminal connection hole formed in the terminal block; and a plurality of conductor bars, each having
one end inserted into one of the penetration holes, and
another end, disposed at a respective terminal connection hole of one of the terminal connecting portions, to connect to a terminal when the terminal is received in the respective terminal connection hole.

2. The current detector of claim 1, wherein the current detection unit and the terminal block are merged together so as to implement an L-shaped structure in a cross sectional view cut along the axial direction of the penetration holes, at least a part of the terminal block standing out from a top surface of the current detection unit so as to establish a protruding portion of the L-shaped structure.

3. The current detector of claim 2, wherein the terminal connecting portions are located on a surface of the terminal block, being opposite to an opposing surface of the terminal block, the opposing surface defining a plane of the protruding portion.

4. The current detector of claim 2, wherein the terminal connecting portions are located on a surface of the terminal block, being opposite to an opposing surface of the terminal block, the opposing surface jointing the current detection unit.

5. The current detector of claim 4, wherein
the terminal block includes a resin body,
for each of the terminal connecting portions, the terminal connection hole has a substantially cylindrical shape and has been formed in the resin body of the terminal block, and
the surface on which the terminal connecting portions are located has a height, measured along the axial direction of the penetration holes, that is greater than a sum of a maximum diameter of the terminal connection hole and twice a minimum thickness of the resin body on either side of the terminal connection hole along the axial direction of the penetration holes, and
the resin thickness is determined in view of mechanical strength and electrical insulation.

6. The current detector of claim 1, wherein the terminal connecting portions are located on a surface perpendicular to the axial direction of the penetration holes.

7. The current detector of claim 1, wherein the terminal connecting portions are located on a surface of the terminal block, being opposite to an opposing surface of the terminal block, the opposing surface jointing the current detection unit.

8. The current detector of claim 7, wherein
the terminal block includes a resin body,
the terminal connection hole of each of the terminal connecting portions has a substantially cylindrical shape and has been formed in the resin body of the terminal block, and
the surface on which the terminal connecting portions are located has a height, measured along the axial direction of the penetration holes, that is greater than a sum of a maximum diameter of the terminal connection hole and twice a minimum thickness of the resin body on either side of the terminal connection hole along the axial direction of the penetration holes, and
the resin thickness is determined in view of mechanical strength and electrical insulation.

9. The current detector of claim 1, wherein, for each of the plurality of conductor bars, the another end has a penetration hole to receive the terminal, the penetration hole being aligned with the respective terminal connection hole.

10. The current detector of claim 1, wherein, for each of the plurality of conductor bars, the another end is attached to an outer surface of the terminal block.

* * * * *